(12) United States Patent
Yuan

(10) Patent No.: US 8,953,333 B2
(45) Date of Patent: Feb. 10, 2015

(54) ELECTRONIC DEVICE AND FIXING STRUCTURE THEREOF

(71) Applicant: Wistron Corporation, New Taipei (TW)

(72) Inventor: Peter Yuan, New Taipei (TW)

(73) Assignee: Wistron Corporation, New Taipei (TW)

(*) Notice: Subject to any disclaimer, the term of this patent is extended or adjusted under 35 U.S.C. 154(b) by 217 days.

(21) Appl. No.: 13/677,304

(22) Filed: Nov. 15, 2012

(65) Prior Publication Data

US 2014/0098510 A1    Apr. 10, 2014

(30) Foreign Application Priority Data

Oct. 8, 2012  (CN) .......................... 2012 1 0378102

(51) Int. Cl.
| | |
|---|---|
| H05K 5/00 | (2006.01) |
| H05K 7/02 | (2006.01) |
| H05K 7/04 | (2006.01) |
| H05K 5/02 | (2006.01) |
| G02F 1/1333 | (2006.01) |
| H05K 7/14 | (2006.01) |

(52) U.S. Cl.
CPC ............ *H05K 5/0221* (2013.01); *G02F 1/1333* (2013.01); *H05K 7/142* (2013.01)
USPC .......................................... 361/759; 361/807

(58) Field of Classification Search
USPC ............ 361/679.01, 748, 752, 759, 801, 802, 361/807
See application file for complete search history.

(56) References Cited

U.S. PATENT DOCUMENTS

| | | | | |
|---|---|---|---|---|
| 5,383,793 A | * | 1/1995 | Hsu et al. ........................ | 439/327 |
| 7,149,094 B2 | * | 12/2006 | Li ................................. | 361/801 |
| 7,262,735 B2 | | 8/2007 | Noe | |
| 7,787,258 B2 | * | 8/2010 | Cheney et al. ................ | 361/801 |
| 8,553,424 B2 | * | 10/2013 | Chiang ......................... | 361/759 |
| 2013/0100619 A1 | * | 4/2013 | Fan ............................... | 361/752 |

* cited by examiner

*Primary Examiner* — Bernard Rojas

(74) *Attorney, Agent, or Firm* — Jianq Chyun IP Office

(57) ABSTRACT

An electronic device includes a fixing structure and an electronic component. The fixing structure includes a base, a locking element, and a fixing element. The base has a first position-limiting portion, a second position-limiting portion, and an assembling portion. The locking element and the fixing element respectively have a first and a second locking portion. When the locking element is assembled to the assembling portion and the first locking portion faces the first position-limiting portion, the fixing element is limited on the first position-limiting portion to lock the second locking portion with the first locking portion. When the locking element is assembled to the assembling portion and the first locking portion faces the second position-limiting portion, the fixing element is limited on the second position-limiting portion to lock the second locking portion with the first locking portion. The electronic component is fixed to the base through the fixing element.

20 Claims, 12 Drawing Sheets

ELECTRONIC DEVICE AND FIXING STRUCTURE THEREOF

CROSS-REFERENCE TO RELATED APPLICATION

This application claims the priority benefit of China application serial no. 201210378102.8, filed on Oct. 8, 2012. The entirety of the above-mentioned patent application is hereby incorporated by reference herein and made a part of this specification.

BACKGROUND OF THE INVENTION

1. Field of the Invention

The invention generally relates to an electronic device and a fixing structure thereof, and more particularly, to an electronic device and a fixing structure thereof for fixing electronic components.

2. Description of Related Art

Along with the development of electronic technologies, different types of electronic products, such as notebook computers, tablet PCs, and smart phones, have been broadly used and become the most indispensable tools to many users. Additionally, electronic components in these electronic products have different specifications and sizes to be selected. For example, convert boards of different specifications and sizes are disposed in liquid crystal displays (LCDs) of different models. Or, wireless local area network (WLAN) cards and 3G network cards have different sizes.

Thereby, studs corresponding to electronic components of different sizes need to be disposed at different positions in an electronic product in order to fasten the electronic components in the electronic product. Since studs are usually integrally formed with plastic parts, they are not movable and are only applicable to electronic components of the same sizes. When the design of the electronic product is changed and electronic components of different specifications and sizes are adopted, a different mould needs to be developed to manufacture plastic parts with studs at different positions. As a result, the manufacturing cost of the electronic product is increased.

SUMMARY OF THE INVENTION

Accordingly, the invention is directed to an electronic device, where the position of a fixing element in a fixing structure of the electronic device can be changed according to the actual requirement.

The invention is directed to a fixing structure, in which the positions of a fixing element can be changed according to the actual requirement.

The invention provides an electronic device including a fixing structure and an electronic component. The fixing structure includes a base, a locking element, and a fixing element. The base has a first position-limiting portion, a second position-limiting portion, and a first assembling portion. The first assembling portion is between the first position-limiting portion and the second position-limiting portion. The locking element has a first locking portion. The fixing element has a second locking portion. When the locking element is assembled to the first assembling portion and the first locking portion is faced towards the first position-limiting portion, the fixing element is suitable for being limited on the first position-limiting portion so that the second locking portion is locked with the first locking portion. When the locking element is assembled to the first assembling portion and the first locking portion is faced towards the second position-limiting portion, the fixing element is suitable for being limited on the second position-limiting portion so that the second locking portion is locked with the first locking portion. The electronic component is fixed to the base through the fixing element.

The invention provides a fixing structure adapted to an electronic device. The electronic device includes an electronic component. The fixing structure includes a base, a locking element, and a fixing element. The base has a first position-limiting portion, a second position-limiting portion, and a first assembling portion. The first assembling portion is between the first position-limiting portion and the second position-limiting portion. The locking element has a first locking portion. The fixing element has a second locking portion. When the locking element is assembled to the first assembling portion and the first locking portion is faced towards the first position-limiting portion, the fixing element is suitable for being limited on the first position-limiting portion so that the second locking portion is locked with the first locking portion. When the locking element is assembled to the first assembling portion and the first locking portion is faced towards the second position-limiting portion, the fixing element is suitable for being limited on the second position-limiting portion so that the second locking portion is locked with the first locking portion. The electronic component is fixed to the base through the fixing element.

According to an embodiment of the invention, the first assembling portion includes a first positioning column and a second positioning column, the locking element has a first positioning hole and a second positioning hole, when the first positioning column is inserted into the first positioning hole and the second positioning column is inserted into the second positioning hole, the first locking portion faces the first position-limiting portion, and when the first positioning column is inserted into the second positioning hole and the second positioning column is inserted into the first positioning hole, the first locking portion faces the second position-limiting portion.

According to an embodiment of the invention, the fixing structure further includes an elastic element disposed between the locking element and the base, wherein the fixing element is suitable for sliding into the first position-limiting portion or the second position-limiting portion along a horizontal direction and moving towards the locking element, so that the second locking portion withstands the elasticity of the elastic element and presses the first locking portion downwards along a vertical direction, and when the second locking portion exceeds the first locking portion along the horizontal direction, the first locking portion returns through the elasticity of the elastic element and is locked with the second locking portion.

According to an embodiment of the invention, the locking element has an opening, the first assembling portion has a pillar, the elastic element is suitable for being penetrated by the pillar, and the pillar is suitable for being inserted into the opening.

According to an embodiment of the invention, the first assembling portion includes at least one sidewall, the sidewall has a slot, the locking element has at least one clasp, the clasp is suitable for being clipped into the slot, and the width of the slot along the vertical direction is greater than the width of the clasp along the vertical direction.

According to an embodiment of the invention, the first locking portion has a first guiding slope, the second locking portion has a second guiding slope, when the fixing element moves towards the locking element along the horizontal direction, the first guiding slope contacts the second guiding slope, and the second locking portion presses the first locking portion downwards along the vertical direction through the guiding of the first guiding slope and the second guiding slope.

According to an embodiment of the invention, the fixing element has a rib, the first position-limiting portion has a first retaining wall, the second position-limiting portion has a second retaining wall, and the rib is suitable for being blocked by the first retaining wall or the second retaining wall to stop the fixing element from moving along the horizontal direction.

According to an embodiment of the invention, the first position-limiting portion has at least one first locking groove, the second position-limiting portion has at least one second locking groove, and the fixing element is suitable for sliding into the first locking groove or the second locking groove along the horizontal direction to be limited on the first position-limiting portion or the second position-limiting portion.

According to an embodiment of the invention, the base has a fixing portion, the electronic component is fixed to the base through the fixing portion, wherein when the fixing element is limited on the first position-limiting portion, the fixing portion and the fixing element have a first distance therebetween, when the fixing element is limited on the second position-limiting portion, the fixing portion and the fixing element have a second distance therebetween, and the first distance is different from the second distance.

According to an embodiment of the invention, the base further has a second assembling portion and a third position-limiting portion, when the locking element is assembled to the second assembling portion and the first locking portion is faced towards the third position-limiting portion, the fixing element is suitable for being limited on the third position-limiting portion so that the second locking portion is locked with the first locking portion.

As described above, in the fixing structure provided by the invention, when the fixing element is limited on the first position-limiting portion on the base and the locking element is assembled to the assembling portion on the base with the first locking portion thereof facing the first position-limiting portion, the locking element can lock the second locking portion of the fixing element through the first locking portion, so that the fixing element is firmly limited on the base and can be used for fixing an electronic component. When electronic components of different specifications and sizes are to be used, the fixing element is limited on the second position-limiting portion on the base instead, and the assembly orientation of the locking element is changed to face the first locking portion towards the second position-limiting portion, so that the locking element can lock the second locking portion of the fixing element through the first locking portion. Accordingly, the fixing element is firmly limited on the base and can be used for fixing electronic components of different specifications and sizes. In other words, the fixing element in the invention is not integrally formed with the base, and the assembly orientation of the locking element can be changed according to the position of the fixing element in order to lock the fixing element at different positions. Thus, it is not needed to develop different moulds for manufacturing bases with the fixing element at different positions, and the position of the fixing element can be conveniently changed to assemble electronic components of different specifications and sizes. Thereby, the manufacturing cost is reduced.

These and other exemplary embodiments, features, aspects, and advantages of the invention will be described and become more apparent from the detailed description of exemplary embodiments when read in conjunction with accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
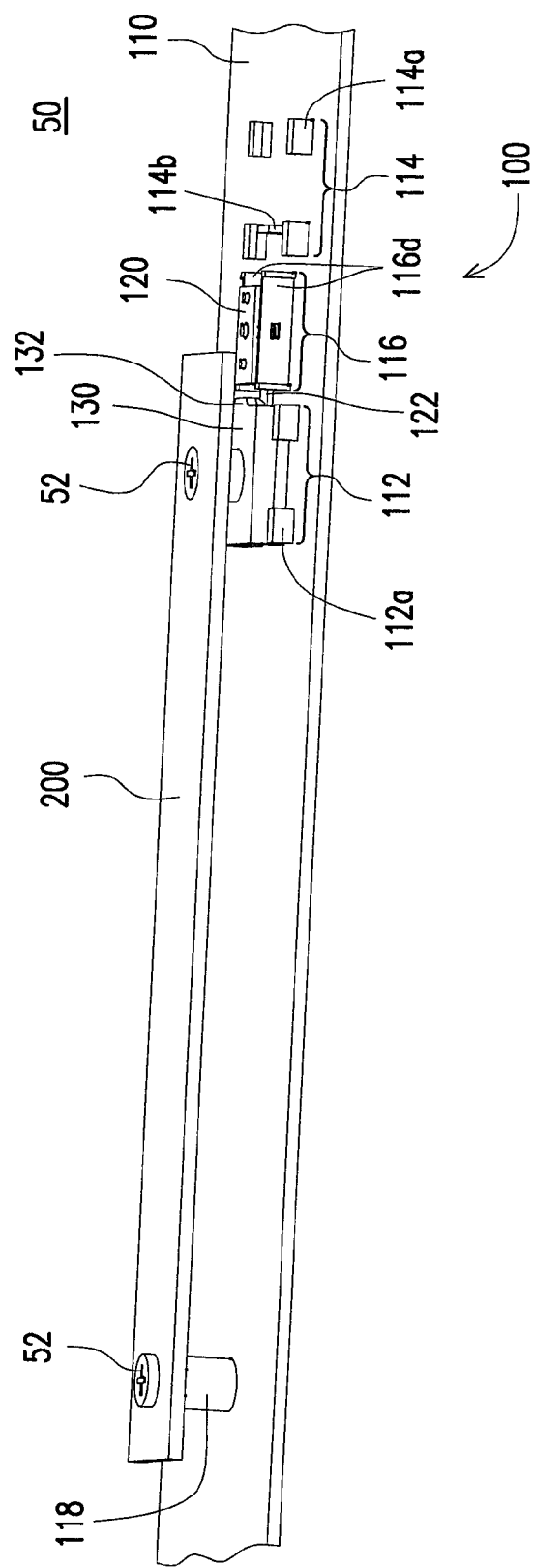
FIG. 1 is a partial perspective view of an electronic device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
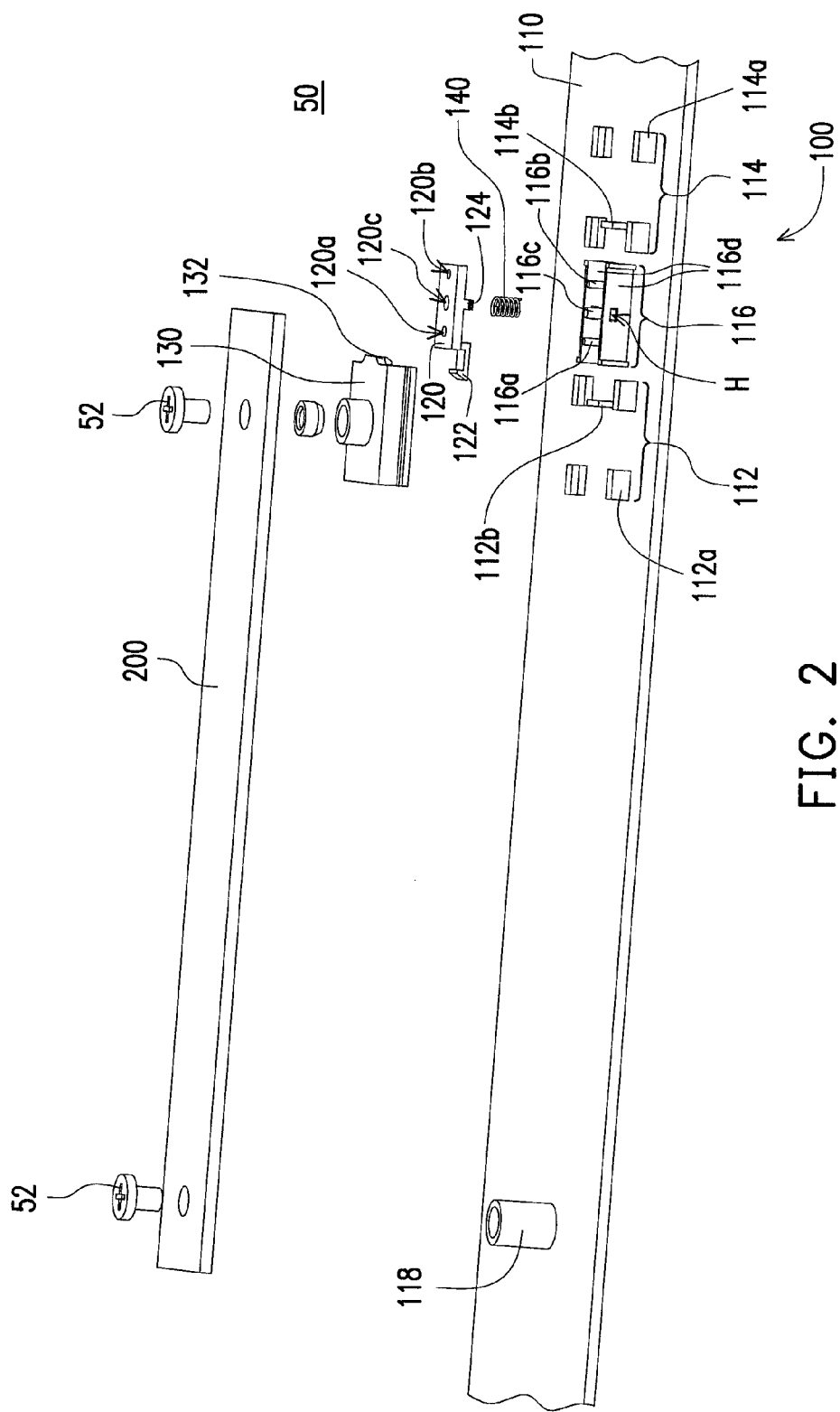
FIG. 2 is an exploded view of the electronic device in FIG. 1.
Figure 3:
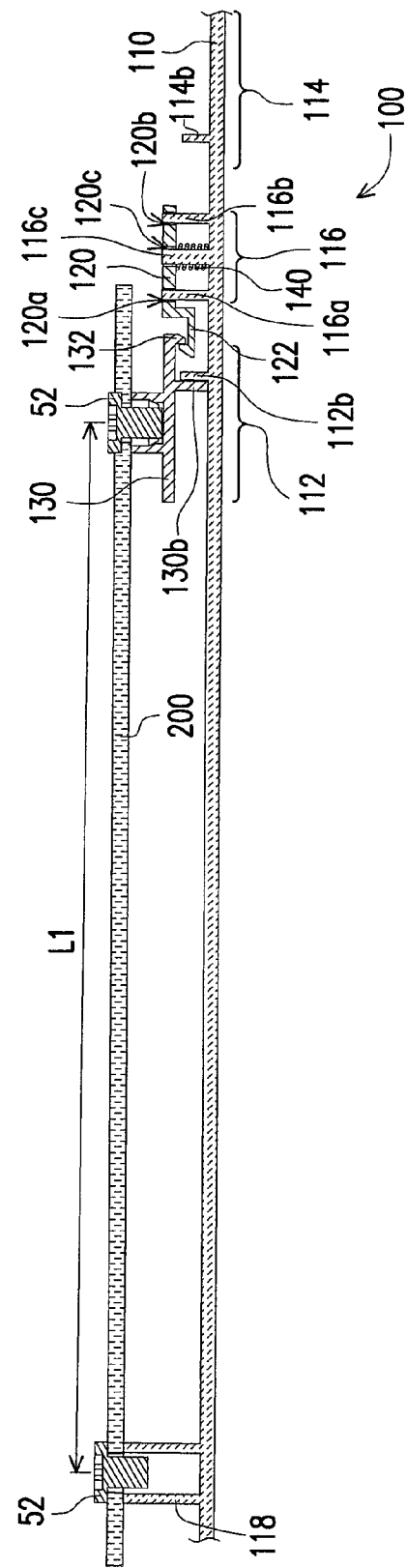
FIG. 3 is a cross-sectional view of the electronic device in FIG. 1.

FIG. 1 is a partial perspective view of an electronic device according to an embodiment of the invention. FIG. 2 is an exploded view of the electronic device in FIG. 1. FIG. 3 is a cross-sectional view of the electronic device in FIG. 1. Referring to FIG. 1 to FIG. 3, the electronic device 50 in the present embodiment includes a fixing structure 100 and an electronic component 200. The fixing structure 100 includes a base 110, a locking element 120, and a fixing element 130. The base 110 has a first position-limiting portion 112, a second position-limiting portion 114, and a first assembling portion 116. The first assembling portion 116 is between the first position-limiting portion 112 and the second position-limiting portion 114.

Figure 4:
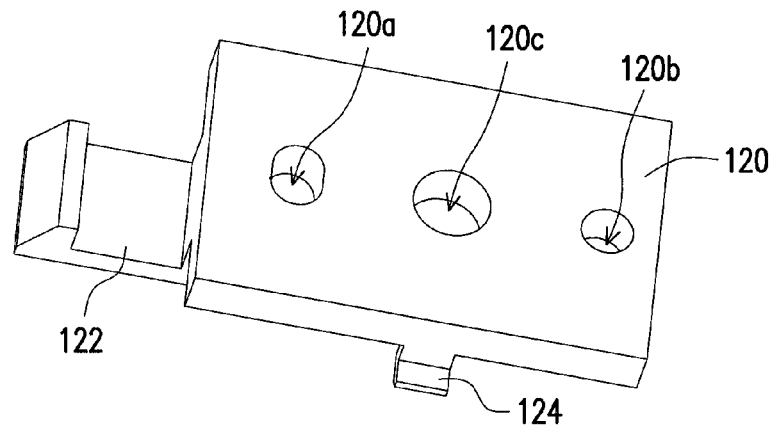
FIG. 4 is a perspective view of a locking element in FIG. 1.
Figure 5:
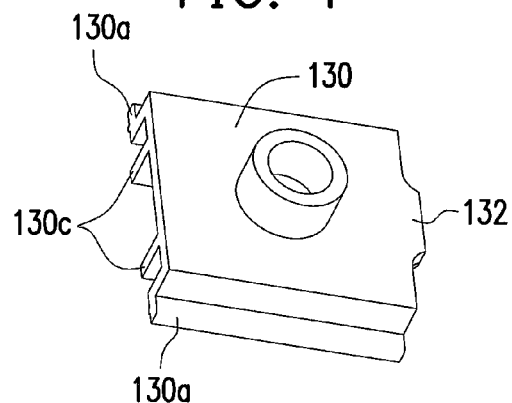
FIG. 5 is a perspective view of a fixing element in FIG. 1.
Figure 6:
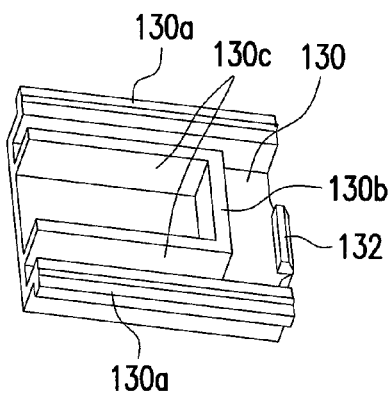
FIG. 6 is a perspective view of the fixing element in FIG. 5 from another viewing angle.

FIG. 4 is a perspective view of the locking element in FIG. 1. FIG. 5 is a perspective view of the fixing element in FIG. 1. FIG. 6 is a perspective view of the fixing element in FIG. 5 from another viewing angle. As shown in FIG. 4, the locking element 120 has a first locking portion 122. As shown in FIG. 5 and FIG. 6, the fixing element 130 has a second locking portion 132. When the locking element 120 is assembled to the first assembling portion 116 and the first locking portion 122 is faced towards the first position-limiting portion 112 (as shown in FIG. 1 and FIG. 3), the fixing element 130 is suitable for being limited on the first position-limiting portion 112, so that the second locking portion 132 is locked with the first locking portion 122. In the present embodiment, the fixing element 130 is a stud, and when the fixing element 130 is limited on the first position-limiting portion 112, the electronic component 200 is screwed and fixed to the base 110 through the fixing element 130 and a screw 52.

Figure 7:
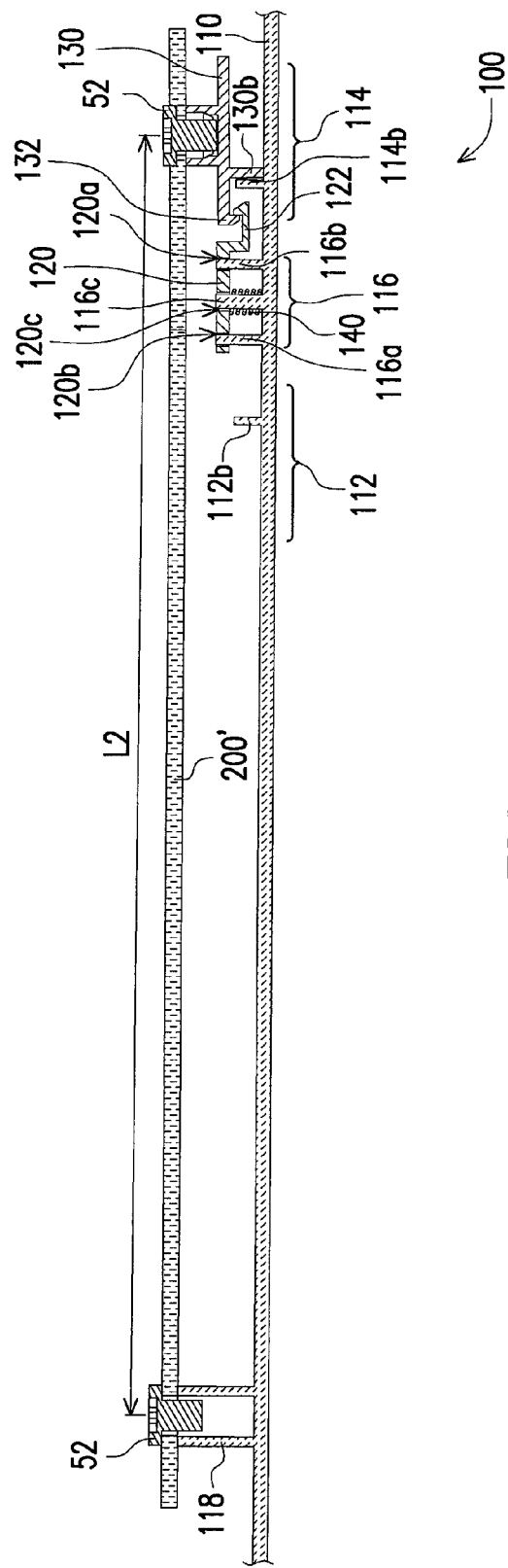
FIG. 7 is a diagram illustrating how an electronic component of a different size is assembled to the electronic device in FIG. 3.

FIG. 7 is a diagram illustrating how an electronic component of a different size is assembled to the electronic device in FIG. 3. When the locking element 120 is assembled to the first assembling portion 116 and the first locking portion 122 is faced towards the second position-limiting portion 114 (as shown in FIG. 7), the fixing element 130 is suitable for being limited on the second position-limiting portion 114 to lock the second locking portion 132 with the first locking portion 122. When the fixing element 130 is limited on the second position-limiting portion 114, the larger electronic component 200' can be screwed and fastened to the base 110 through the fixing element 130 and the screw 52.

In the present embodiment, the electronic device 100 is a liquid crystal display (LCD), the electronic component 200 is a small-sized conversion card, and the electronic component 200' is a large-sized conversion card. When the fixing element 130 is limited on the first position-limiting portion 112 on the base 110 and the locking element 120 is assembled to the first assembling portion 116 on the base 110 to face the first locking portion 122 towards, the first position-limiting portion 112, the locking element 120 is locked with the second locking portion 132 of the fixing element 130 through the first locking portion 122, so that the fixing element 130 is firmly limited onto the base 110 and can be used for fixing a small-sized conversion card (for example, the electronic component 200). When a conversion card of different specification and size is to be used, the fixing element 130 is limited on the second position-limiting portion 114 on the base 110 instead, and the assembly orientation of the locking element 120 is changed to face the first locking portion 122 towards the second position-limiting portion 114, so that the locking element 120 is locked with the second locking portion 132 of the fixing element 130 through the first locking portion 122, and the fixing element 130 is firmly limited onto the base 110 and can be used for fixing a large-sized conversion card (for example, the electronic component 200'). In other words, the fixing element 130 in the invention is not integrally formed with the base 110, and the assembly orientation of the locking element 120 can be changed with the position of the fixing element 130 to lock the fixing element 130 at different positions. Thus, it is not needed to develop different moulds for manufacturing the base with the fixing element at different positions, and the position of the fixing element can be conveniently changed to assemble electronic components of different specifications and sizes. Thereby, the manufacturing cost is reduced.

In the present embodiment, the base 110 has a fixing portion 118. The fixing portion 118 may be a stud. When the fixing element 130 is limited on the first position-limiting portion 112 (as shown in FIG. 3), the fixing portion 118 and the fixing element 130 have a first distance L1 therebetween, and the electronic component 200 is suitable for being fixed to the base 110 through the screw 52, the fixing portion 118, and the fixing element 130 (as shown in FIG. 1 and FIG. 3). When the fixing element 130 is limited on the second position-limiting portion 114 (as shown in FIG. 7), the fixing portion 118 and the fixing element 130 have a second distance L2 therebetween which is greater than the first distance L1, such that the large-sized electronic component 200' can be fixed to the base 110 through the screw 52, the fixing portion 118 and the fixing element 130 (as shown in FIG. 7).

Figure 8:
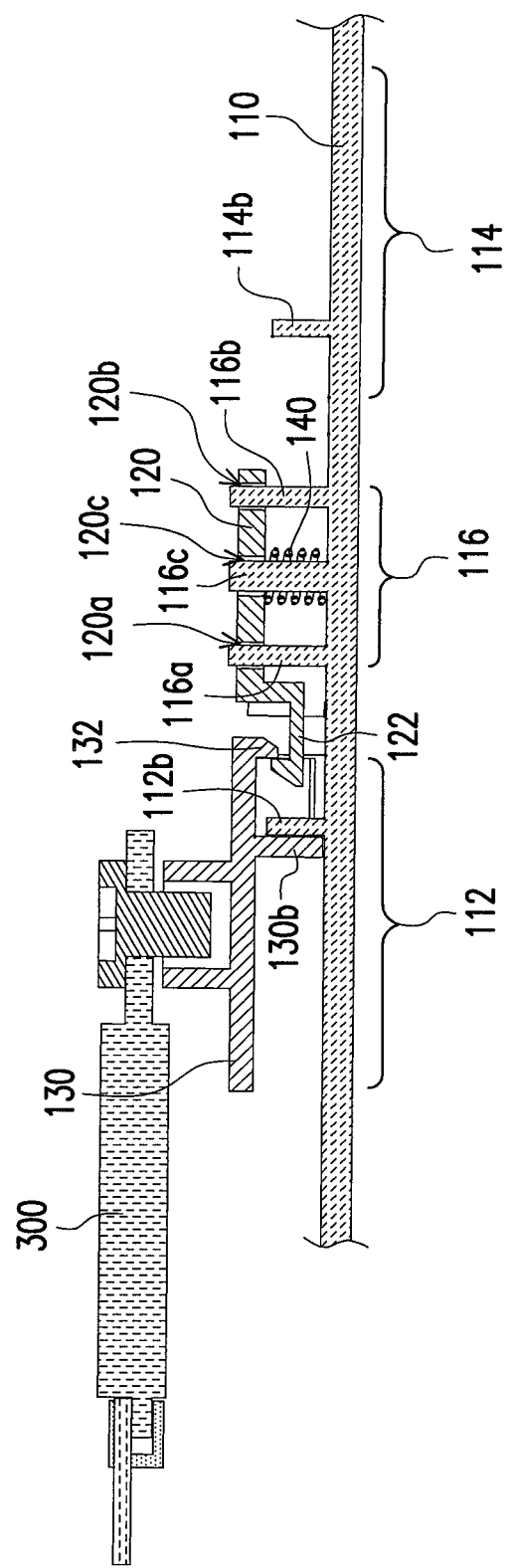
FIG. 8 and FIG. 9 respectively illustrate how a network card of different size is fixed to the fixing structure in FIG. 3.
Figure 9:
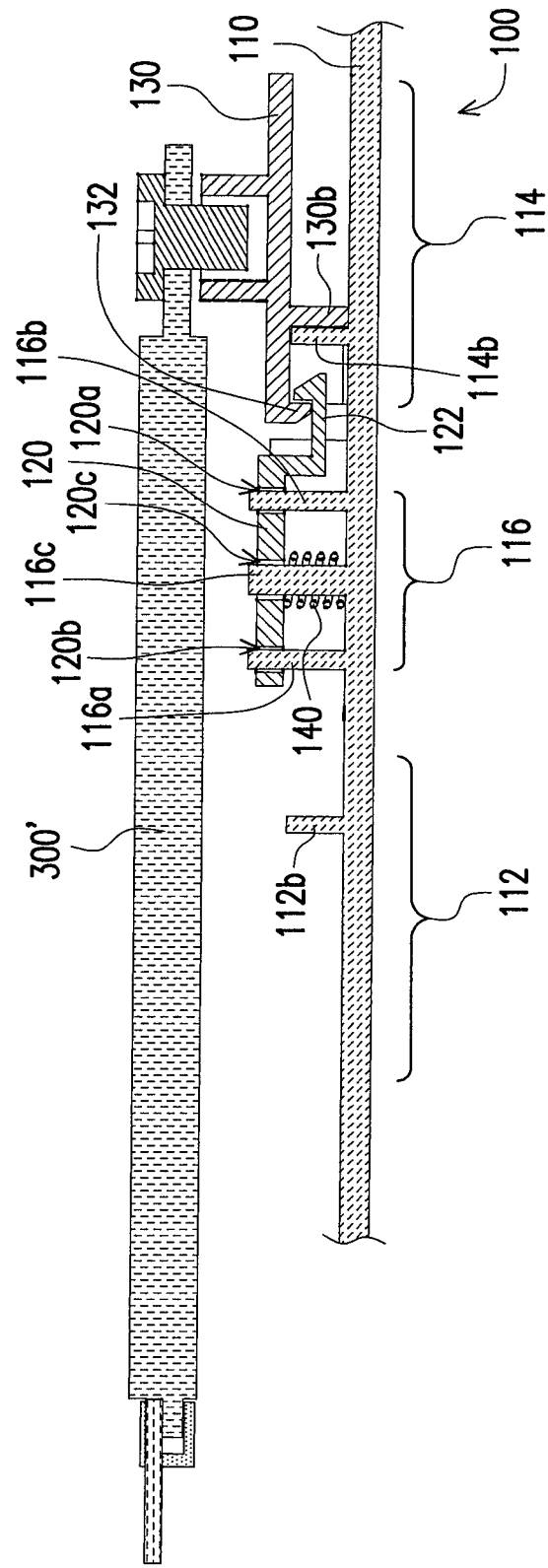

Besides being used for fixing conversion cards, the fixing structure 100 may also be used for fixing other suitable electronic components. The type of the electronic component is not limited in the invention. FIG. 8 and FIG. 9 respectively illustrate how a network card of different size is fixed to the fixing structure in FIG. 3. For example, when the fixing element 130 is limited on the first position-limiting portion 112, the fixing structure 100 can fix an electronic component 300 (a small-sized network card (for example, a wireless LAN card), as shown in FIG. 8), and when the fixing element 130 is limited on the second position-limiting portion 114, the fixing structure 100 can fix an electronic component 300' (a large-sized network card (for example, a 3G network card), as shown in FIG. 9).

Figure 10:
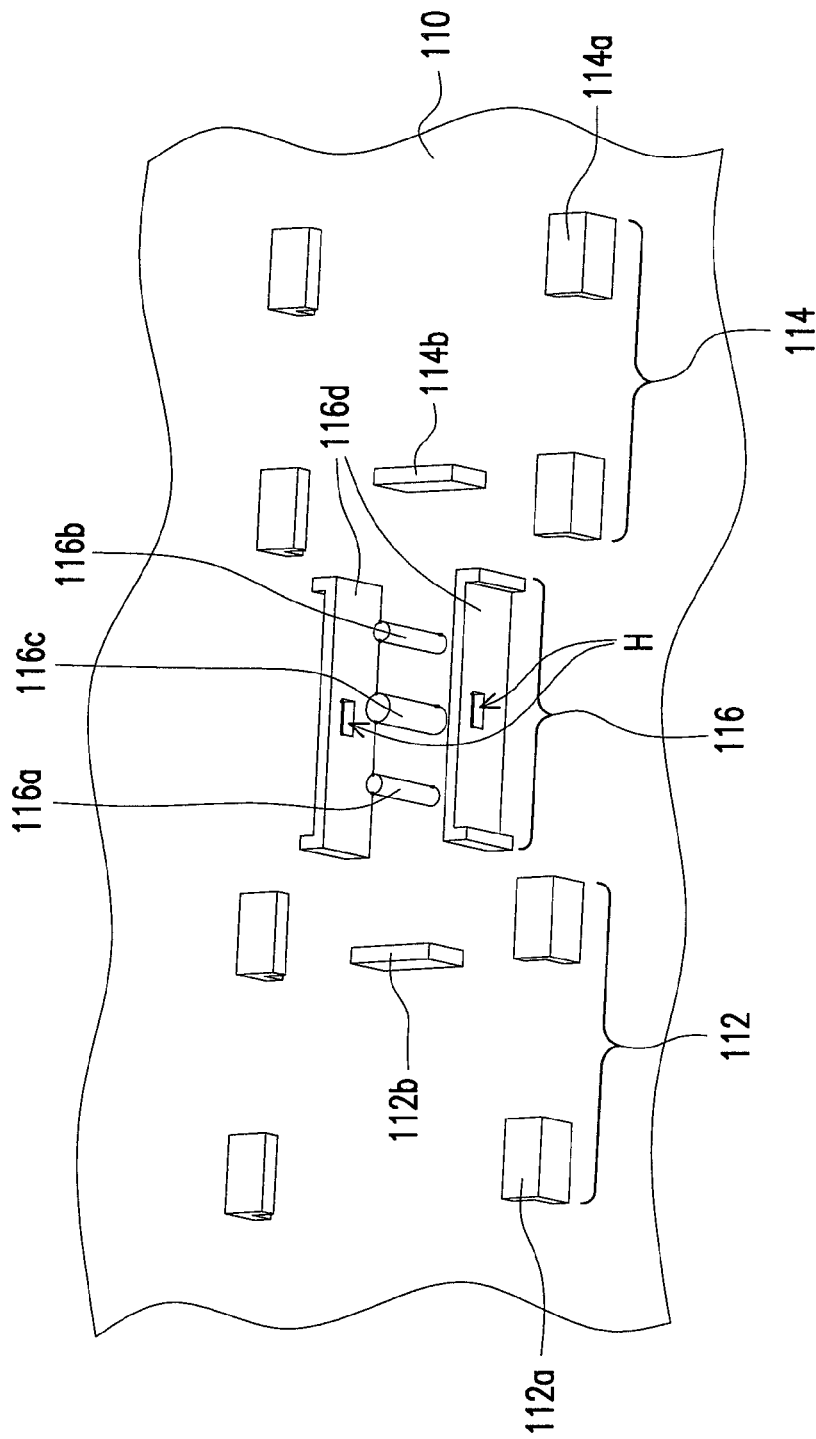
FIG. 10 is a partial perspective view of a base in FIG. 1.

FIG. 10 is a partial perspective view of the base in FIG. 1. Referring to FIG. 4 and FIG. 10, to be specific, the first assembling portion 116 includes a first positioning column 116a and a second positioning column 116b, and the locking element 120 has a first positioning hole 120a and a second positioning hole 120b. When the first positioning column 116a is inserted into the first positioning hole 120a and the second positioning column 116b is inserted into the second positioning hole 120b (as shown in FIG. 3), the first locking portion 122 is faced towards the first position-limiting portion 112, and when the first positioning column 116a is inserted into the second positioning hole 120b and the second positioning column 116b is inserted into the first positioning hole 120a (as shown in FIG. 7), the first locking portion 122 is faced towards the second position-limiting portion 114, so that the orientation of the first locking portion 122 is changed through different assembly modes.

As shown in FIG. 2 and FIG. 3, in the present embodiment, the fixing structure 100 further includes an elastic element 140. The elastic element 140 may be a spring and is disposed between the locking element 120 and the base 110 so that the locking element 120 can be conveniently assembled and dissembled. Below, how the locking element 120 is assembled will be explained in detail with reference to accompanying drawings.

Figure 11A:
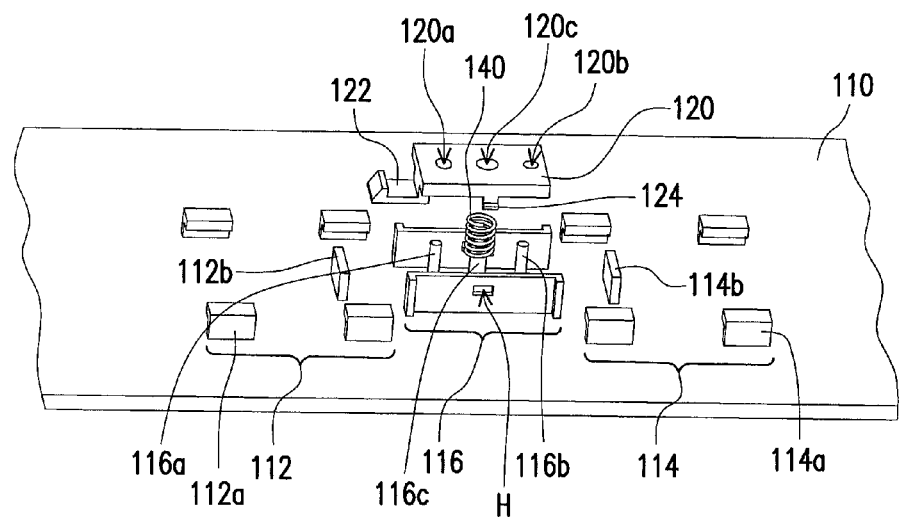
FIGS. 11A-11D illustrate the procedure of assembling a locking element in FIG. 2 to a base.
Figure 11B:
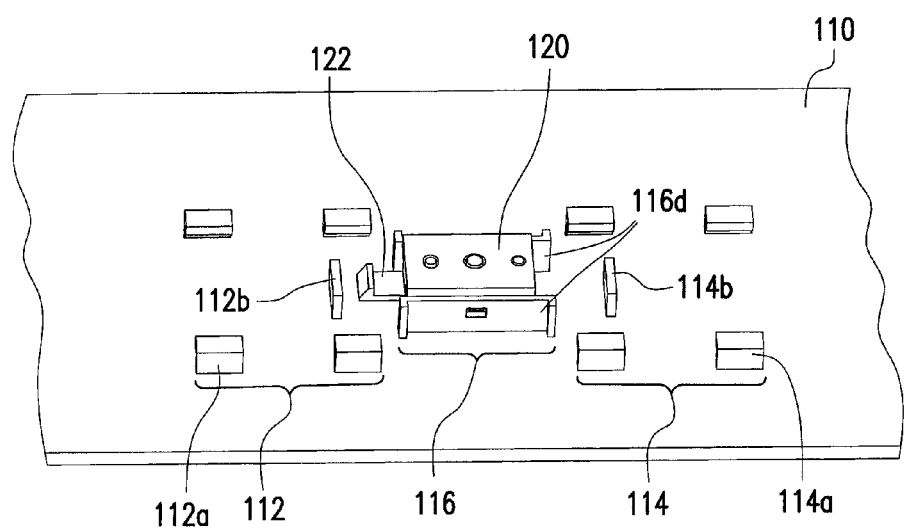
Figure 11C:
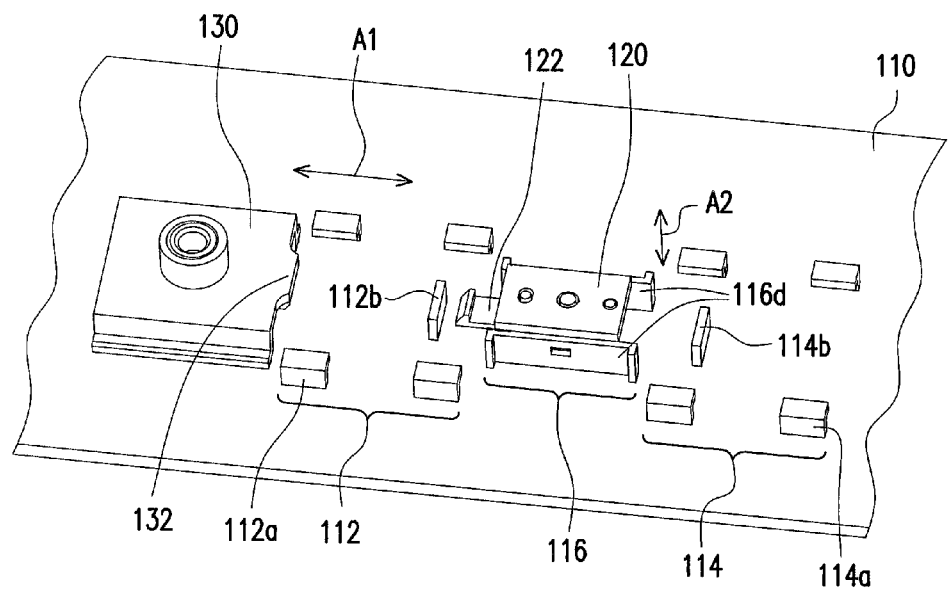
Figure 11D:
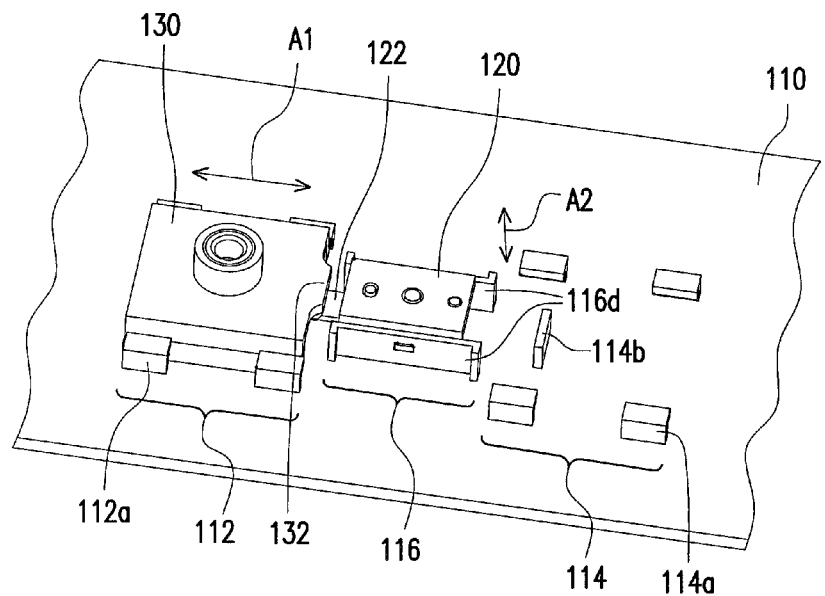

FIGS. 11A-11D illustrate the procedure of assembling the locking element in FIG. 2 to the base. First, as shown in FIG. 11A, the elastic element 140 is penetrated by a pillar 116c of the first assembling portion 116. Then, as shown in FIG. 11B, the locking element 120 is locked to the first assembling portion 116 so that the elastic element 140 (as shown in FIG. 11A) is located between the locking element 120 and the base 110 and the pillar 116c is inserted into the opening 120c of the locking element 120. As shown in FIG. 11C and FIG. 11D, the fixing element 130 is slid to the first position-limiting portion 112 or the second position-limiting portion 114 (illustrated as to the first position-limiting portion 112) along a horizontal direction A1 and moved towards the locking element 120, so that the first locking portion 122 of the locking element 120 withstands the elasticity of the elastic element 140 and is locked to the second locking portion 132 of the fixing element 130.

Figure 12A:
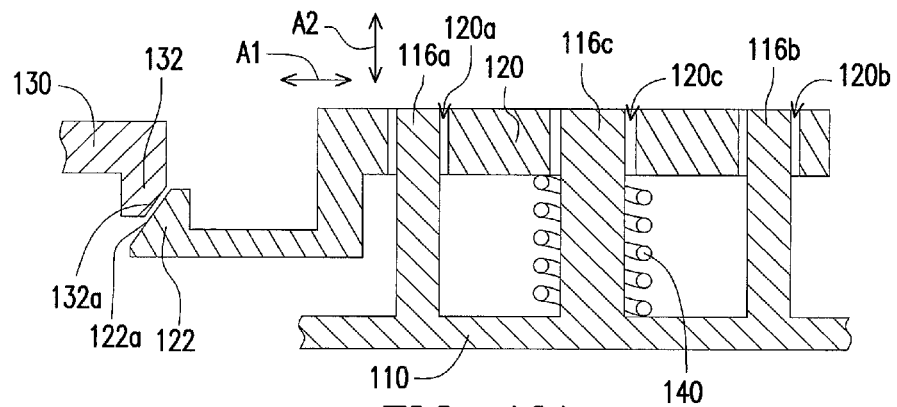
FIGS. 12A-12C illustrate the procedure of locking a first locking portion in FIG. 11C with a second locking portion.
Figure 12B:
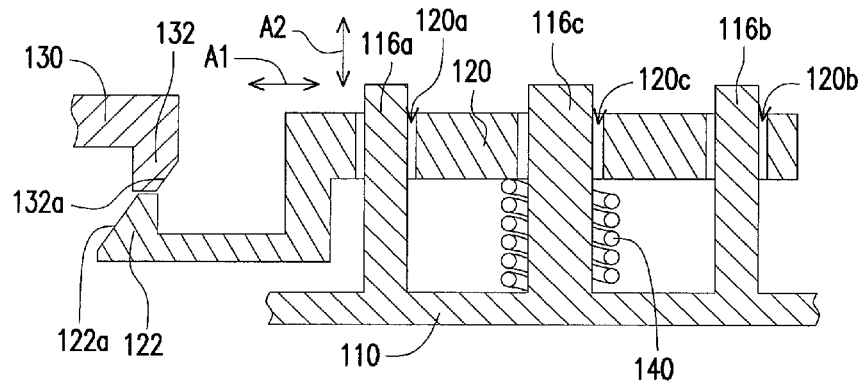
Figure 12C:
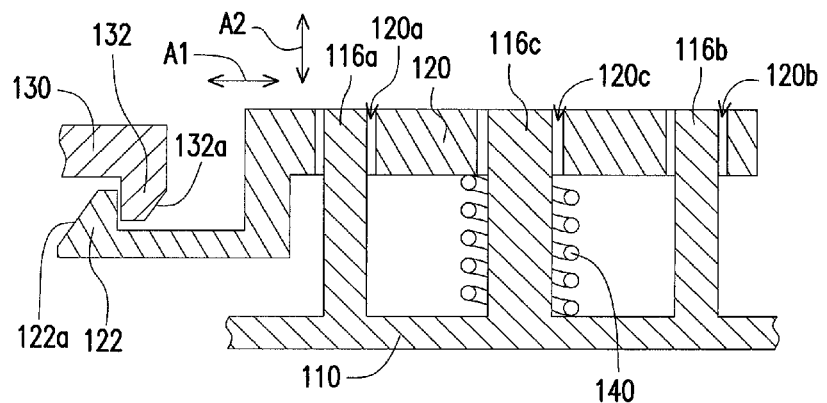

FIGS. 12A-12C illustrate the procedure of locking a first locking portion in FIG. 11C with a second locking portion. Referring to FIG. 12A-FIG. 12C, to be specific, the first locking portion 122 has a first guiding slope 122a, and the second locking portion 132 has a second guiding slope 132a. When the fixing element 130 is moved towards the locking element 120 among the horizontal direction A1 (as shown in FIGS. 12A-12B), the first guiding slope 122a contacts the second guiding slope 132a, and the second locking portion 132 is guided by the first guiding slope 122a and the second guiding slope 132a to withstand the elasticity of the elastic element 140 and press the first locking portion 122 downwards along a vertical direction A2. When the second locking portion 132a exceeds the first locking portion 122a along the horizontal direction A1 (as shown in FIG. 12C), the first locking portion 122a returns through the elasticity of the elastic element 140 and is locked to the second locking portion 132a. To disassemble the fixing element 130 and the locking element 120, the locking element 120 in FIG. 12C can be pressed downwards against the elasticity of the elastic element 140 to release the first locking portion 122a from the second locking portion 132a.

Figure 13:
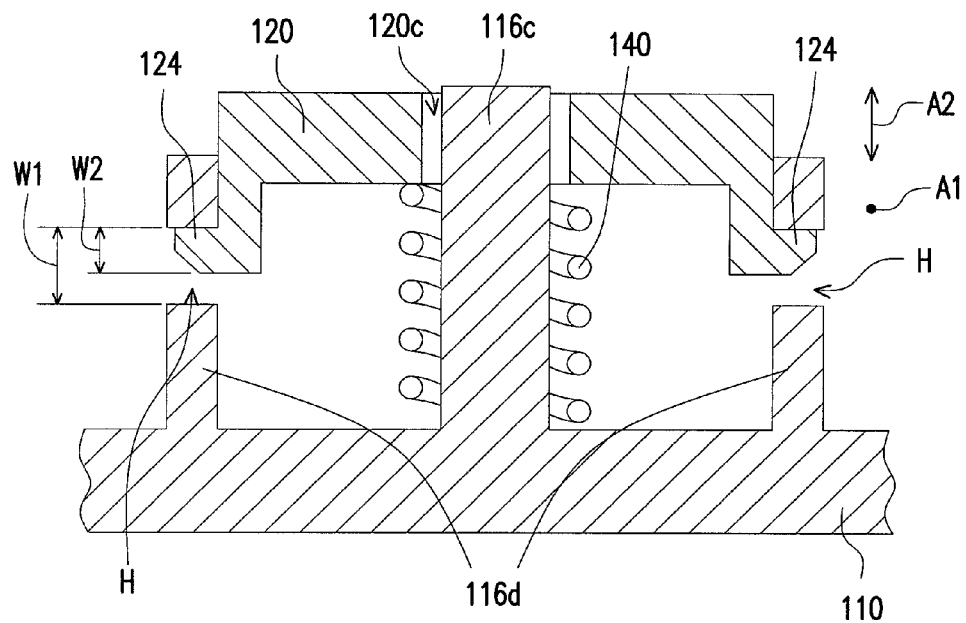
FIG. 13 is a partial cross-sectional view of the electronic device in FIG. 1.

FIG. 13 is a partial cross-sectional view of the electronic device in FIG. 1. Referring to FIG. 4, FIG. 10, and FIG. 13, the first assembling portion 116 includes at least one sidewall 116d (two are illustrated). Each sidewall 116d has a slot H. The locking element 120 has at least one clasp 124 (two are illustrated). Each clasp 124 is suitable for being clipped into the corresponding slot H to lock the locking element 120 to the first assembling portion 116. As shown in FIG. 13, the width W1 of each slot H along the vertical direction A2 is greater than the width W2 of each clasp 124 along the vertical direction A2. Thus, the locking element 120 can withstand the elasticity of the elastic element 140 to descend relative to the first assembling portion 116 and ascend with the help of the elasticity of the elastic element 140 along the vertical direction A2, so that the assembly procedure illustrated in FIGS. 12A-12C can be carried out.

Referring to FIG. 10, in the present embodiment, the first position-limiting portion 112 has at least one first locking groove 112a (multiple ones are illustrated), and the second position-limiting portion 114 has at least one second locking groove 114a (multiple ones are illustrated). The fixing element 130 is suitable for being slid into the first locking groove 112a or the second locking groove 114a (illustrated as being slid into the first locking groove 112a) through the ribs 130a disposed at both sides of the fixing element 130 along the horizontal direction A1 (as shown in FIGS. 11C-11D), so as to be limited on the first position-limiting portion 112 or the second position-limiting portion 114.

Referring to FIG. 6 and FIG. 10, in the present embodiment, the fixing element 130 has a rib 130b, the first position-limiting portion 112 has a first retaining wall 112b, and the second position-limiting portion 114 has a second retaining wall 114b. The rib 130b is suitable for being blocked by the first retaining wall 112b (as shown in FIG. 3) or by the second retaining wall 114b (as shown in FIG. 7) to stop the fixing element 130 from moving along the horizontal direction A1 (indicated in FIG. 11D). In addition, the fixing element 130 further has a supporting rib 130c (as shown in FIG. 6) for supporting the fixing element 130 on the base 110 in the vertical direction A2 (indicated in FIG. 11D).

Figure 14:
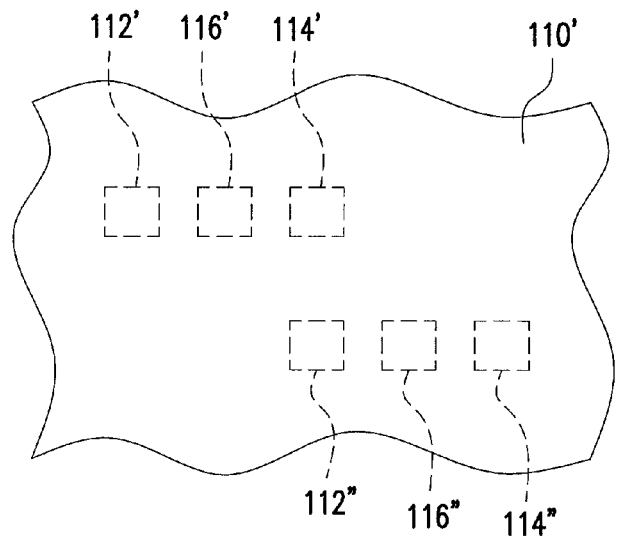
FIG. 14 is a top view of a base according to another embodiment of the invention.

FIG. 14 is a top view of a base according to another embodiment of the invention. Referring to FIG. 14, in the base 110', the first position-limiting portion 112', the second position-limiting portion 114', and the first assembling portion 116' are denoted with dotted frames, and the disposition of the first position-limiting portion 112', the second position-limiting portion 114', and the first assembling portion 116' is similar to that of the first position-limiting portion 112, the second position-limiting portion 114, and the first assembling portion 116 therefore will not be described herein. The difference between the base 110' in the present embodiment and the base 110 described above is that the base 110' further has a second assembling portion 116", a third position-limiting portion 112", and a fourth position-limiting portion 114". The disposition of the second assembling portion 116", the third position-limiting portion 112", and the fourth position-limiting portion 114" is similar to that of the first assembling portion 116', the first position-limiting portion 112', and the second position-limiting portion 114', but the positions of the second assembling portion 116", the third position-limiting portion 112", and the fourth position-limiting portion 114" are different from those of the first assembling portion 116', the first position-limiting portion 112', and the second position-limiting portion 114'. Besides assembling the locking element 120 in FIG. 4 to the first assembling portion 116' with the first locking portion 122 of the locking element 120 facing the first position-limiting portion 112' or the second position-limiting portion 114', the locking element 120 in FIG. 4 may also be assembled to the second assembling portion 116" to face the first locking portion 122 of the locking element 120 towards the third position-limiting portion 112" or the fourth position-limiting portion 114", so that the fixing element 130 in FIG. 5 can be limited on the third position-limiting portion 112" and locked with the first locking portion 122 through the second locking portion 132, or the fixing element 130 in FIG. 5 can be limited on the fourth position-limiting portion 114" and locked with the first locking portion 122 through the second locking portion 132. Thereby, the fixing element 130 can be assembled to different position on the base 110' according to the actual requirement and used for fixing electronic components of different specifications and sizes.

As described above, in a fixing structure provided by the invention, when the fixing element is limited on the first position-limiting portion on the base and the locking element is assembled to the assembling portion on the base with the first locking portion thereof facing the first position-limiting portion, the locking element can lock the second locking portion of the fixing element through the first locking portion, so that the fixing element is firmly limited on the base and can be used for fixing an electronic component. When electronic components of different specifications and sizes are to be used, the fixing element is limited on the second position-limiting portion on the base instead, and the assembly orientation of the locking element is changed to face the first locking portion towards the second position-limiting portion, so that the locking element can lock the second locking portion of the fixing element through the first locking portion. Accordingly, the fixing element is firmly limited on the base and can be used for fixing electronic components of different specifications and sizes. In other words, the fixing element in the invention is not integrally formed with the base, and the assembly orientation of the locking element can be changed according to the position of the fixing element in order to lock the fixing element at different positions. Thus, it is not needed to develop different moulds for manufacturing bases with the fixing element at different positions, and the position of the fixing element can be conveniently changed to assemble electronic components of different specifications and sizes. Thereby, the manufacturing cost is reduced.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:
1. An electronic device, comprising:
 a fixing structure, comprising:
  a base, having a first position-limiting portion, a second position-limiting portion, and a first assembling portion, wherein the first assembling portion is between the first position-limiting portion and the second position-limiting portion;
a locking element, having a first locking portion; and
a fixing element, having a second locking portion, wherein when the locking element is assembled to the first assembling portion and the first locking portion is faced towards the first position-limiting portion, the fixing element is limited on the first position-limiting portion so that the second locking portion is locked with the first locking portion, and when the locking element is assembled to the first assembling portion and the first locking portion is faced towards the second position-limiting portion, the fixing element is limited on the second position-limiting portion so that the second locking portion is locked with the first locking portion; and
an electronic component, fixed to the base through the fixing element.

2. The electronic device according to claim 1, wherein the first assembling portion comprises a first positioning column and a second positioning column, the locking element has a first positioning hole and a second positioning hole, when the first positioning column is inserted into the first positioning hole and the second positioning column is inserted into the second positioning hole, the first locking portion faces the first position-limiting portion, and when the first positioning column is inserted into the second positioning hole and the second positioning column is inserted into the first positioning hole, the first locking portion faces the second position-limiting portion.

3. The electronic device according to claim 1, wherein the fixing structure further comprises an elastic element disposed between the locking element and the base, the fixing element is suitable for sliding into the first position-limiting portion or the second position-limiting portion along a horizontal direction and moving towards the locking element, so that the second locking portion withstands an elasticity of the elastic element and presses the first locking portion downwards along a vertical direction, and when the second locking portion exceeds the first locking portion along the horizontal direction, the first locking portion returns through the elasticity of the elastic element and is locked to the second locking portion.

4. The electronic device according to claim 3, wherein the locking element has an opening, the first assembling portion has a pillar, the elastic element is suitable for being penetrated by the pillar, and the pillar is suitable for being inserted into the opening.

5. The electronic device according to claim 3, wherein the first assembling portion comprises at least one sidewall, the sidewall has a slot, the locking element has at least one clasp, the clasp is suitable for being clipped into the slot, and a width of the slot along the vertical direction is greater than a width of the clasp along the vertical direction.

6. The electronic device according to claim 3, wherein the first locking portion has a first guiding slope, the second locking portion has a second guiding slope, when the fixing element moves towards the locking element along the horizontal direction, the first guiding slope contacts the second guiding slope, and the second locking portion presses the first locking portion downwards along the vertical direction through the guiding of the first guiding slope and the second guiding slope.

7. The electronic device according to claim 3, wherein the fixing element has a rib, the first position-limiting portion has a first retaining wall, the second position-limiting portion has a second retaining wall, and the rib is suitable for being blocked by the first retaining wall or the second retaining wall to stop the fixing element from moving along the horizontal direction.

8. The electronic device according to claim 3, wherein the first position-limiting portion has at least one first locking groove, the second position-limiting portion has at least one second locking groove, and the fixing element is suitable for sliding into the first locking groove or the second locking groove along the horizontal direction to be limited on the first position-limiting portion or the second position-limiting portion.

9. The electronic device according to claim 1, wherein the base has a fixing portion, the electronic component is fixed to the base through the fixing portion, when the fixing element is limited on the first position-limiting portion, the fixing portion and the fixing element have a first distance therebetween, when the fixing element is limited on the second position-limiting portion, the fixing portion and the fixing element have a second distance therebetween, and the first distance is different from the second distance.

10. The electronic device according to claim 1, wherein the base further has a second assembling portion and a third position-limiting portion, when the locking element is assembled to the second assembling portion and the first locking portion is faced towards the third position-limiting portion, the fixing element is suitable for being limited on the third position-limiting portion so that the second locking portion is locked with the first locking portion.

11. A fixing structure, adapted to an electronic device, wherein the electronic device comprises an electronic component, the fixing structure comprising:
a base, having a first position-limiting portion, a second position-limiting portion, and a first assembling portion, wherein the first assembling portion is between the first position-limiting portion and the second position-limiting portion;
a locking element, having a first locking portion; and
a fixing element, having a second locking portion, wherein when the locking element is assembled to the first assembling portion and the first locking portion is faced towards the first position-limiting portion, the fixing element is limited on the first position-limiting portion so that the second locking portion is locked with the first locking portion, and when the locking element is assembled to the first assembling portion and the first locking portion is faced towards the second position-limiting portion, the fixing element is limited on the second position-limiting portion so that the second locking portion is locked with the first locking portion, wherein the electronic component is fixed to the base through the fixing element.

12. The fixing structure according to claim 11, wherein the first assembling portion comprises a first positioning column and a second positioning column, the locking element has a first positioning hole and a second positioning hole, when the first positioning column is inserted into the first positioning hole and the second positioning column is inserted into the second positioning hole, the first locking portion faces the first position-limiting portion, and when the first positioning column is inserted into the second positioning hole and the second positioning column is inserted into the first positioning hole, the first locking portion faces the second position-limiting portion.

13. The fixing structure according to claim 11 further comprising an elastic element disposed between the locking element and the base, wherein the fixing element is suitable for sliding into the first position-limiting portion or the second position-limiting portion along a horizontal direction and moving towards the locking element, so that the second locking portion withstands an elasticity of the elastic element and presses the first locking portion downwards along a vertical direction, and when the second locking portion exceeds the first locking portion along the horizontal direction, the first locking portion returns through the elasticity of the elastic element and is locked to the second locking portion.

14. The fixing structure according to claim 13, wherein the locking element has an opening, the first assembling portion has a pillar, the elastic element is suitable for being penetrated by the pillar, and the pillar is suitable for being inserted into the opening.

15. The fixing structure according to claim 13, wherein the first assembling portion comprises at least one sidewall, the sidewall has a slot, the locking element has at least one clasp, the clasp is suitable for being clipped into the slot, and a width of the slot along the vertical direction is greater than a width of the clasp along the vertical direction.

16. The fixing structure according to claim 13, wherein the first locking portion has a first guiding slope, the second locking portion has a second guiding slope, when the fixing element moves towards the locking element along the horizontal direction, the first guiding slope contacts the second guiding slope, and the second locking portion presses the first locking portion downwards along the vertical direction through the guiding of the first guiding slope and the second guiding slope.

17. The fixing structure according to claim 13, wherein the fixing element has a rib, the first position-limiting portion has a first retaining wall, the second position-limiting portion has a second retaining wall, and the rib is suitable for being blocked by the first retaining wall or the second retaining wall to stop the fixing element from moving along the horizontal direction.

18. The fixing structure according to claim 13, wherein the first position-limiting portion has at least one first locking groove, the second position-limiting portion has at least one second locking groove, and the fixing element is suitable for sliding into the first locking groove or the second locking groove along the horizontal direction to be limited on the first position-limiting portion or the second position-limiting portion.

19. The fixing structure according to claim 11, wherein the base has a fixing portion, the electronic component is fixed to the base through the fixing portion, when the fixing element is limited on the first position-limiting portion, the fixing portion and the fixing element have a first distance therebetween, when the fixing element is limited on the second position-limiting portion, the fixing portion and the fixing element have a second distance therebetween, and the first distance is different from the second distance.

20. The fixing structure according to claim 11, wherein the base further has a second assembling portion and a third position-limiting portion, when the locking element is assembled to the second assembling portion and the first locking portion is faced towards the third position-limiting portion, the fixing element is suitable for being limited on the third position-limiting portion so that the second locking portion is locked with the first locking portion.

* * * * *